United States Patent
Tsukagoshi et al.

(10) Patent No.: US 6,605,929 B2
(45) Date of Patent: Aug. 12, 2003

(54) POWER SUPPLY NOISE SENSOR

(75) Inventors: Tsuneo Tsukagoshi, Tokyo (JP); Shuichi Nitta, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/059,005

(22) Filed: Jan. 30, 2002

(65) Prior Publication Data

US 2002/0105308 A1 Aug. 8, 2002

(30) Foreign Application Priority Data

Jan. 31, 2001 (JP) ........................................ 2001-024862

(51) Int. Cl.[7] ............................................... G05F 1/613
(52) U.S. Cl. ..................................................... 323/223
(58) Field of Search ........................... 363/39; 323/223, 323/226, 265, 266, 270, 273, 275, 303

(56) References Cited

U.S. PATENT DOCUMENTS 6,163,267 A * 12/2000 Su ............................... 340/683
6,337,823 B1 * 1/2002 Seo et al. ..................... 365/205

FOREIGN PATENT DOCUMENTS

| JP | 9-54620 | 2/1997 |
| JP | 2703890 | 10/1997 |
| JP | 2953761 | 7/1999 |

OTHER PUBLICATIONS

"Noise of Control Devices and Countermeasure against Noise" written in IEEJ Technical Report II, No. 123, published in 1979, pp. 1–56.

* cited by examiner

Primary Examiner—Matthew Nguyen
(74) Attorney, Agent, or Firm—Sughrue Mion, PLLC

(57) ABSTRACT

A power supply noise sensor includes a noise sensing section A to sense impulse noise applied to a power supply line and an output holding section B to hold a sense output from the noise sensing section A. The noise sensing section A includes a time constant circuit to gradually vary a power supply voltage including impulse noise. When a peak value of the impulse noise reduces after the peak value exceeds a predetermined value, a direction of a current flowing through the time constant circuit is inverted to hold a noise output from the output holding section B also after the impulse noise disappears. Therefore, the impulse noise in the forward direction and the impulse noise in the reverse direction superimposed onto the power supply system of the sensor can be sensed in a simple configuration.

12 Claims, 7 Drawing Sheets

INITIAL STATE : T1: ON, T2: OFF

FORWARD-DIRECTIONAL NOISE

REVERSE-DIRECTIONAL NOISE

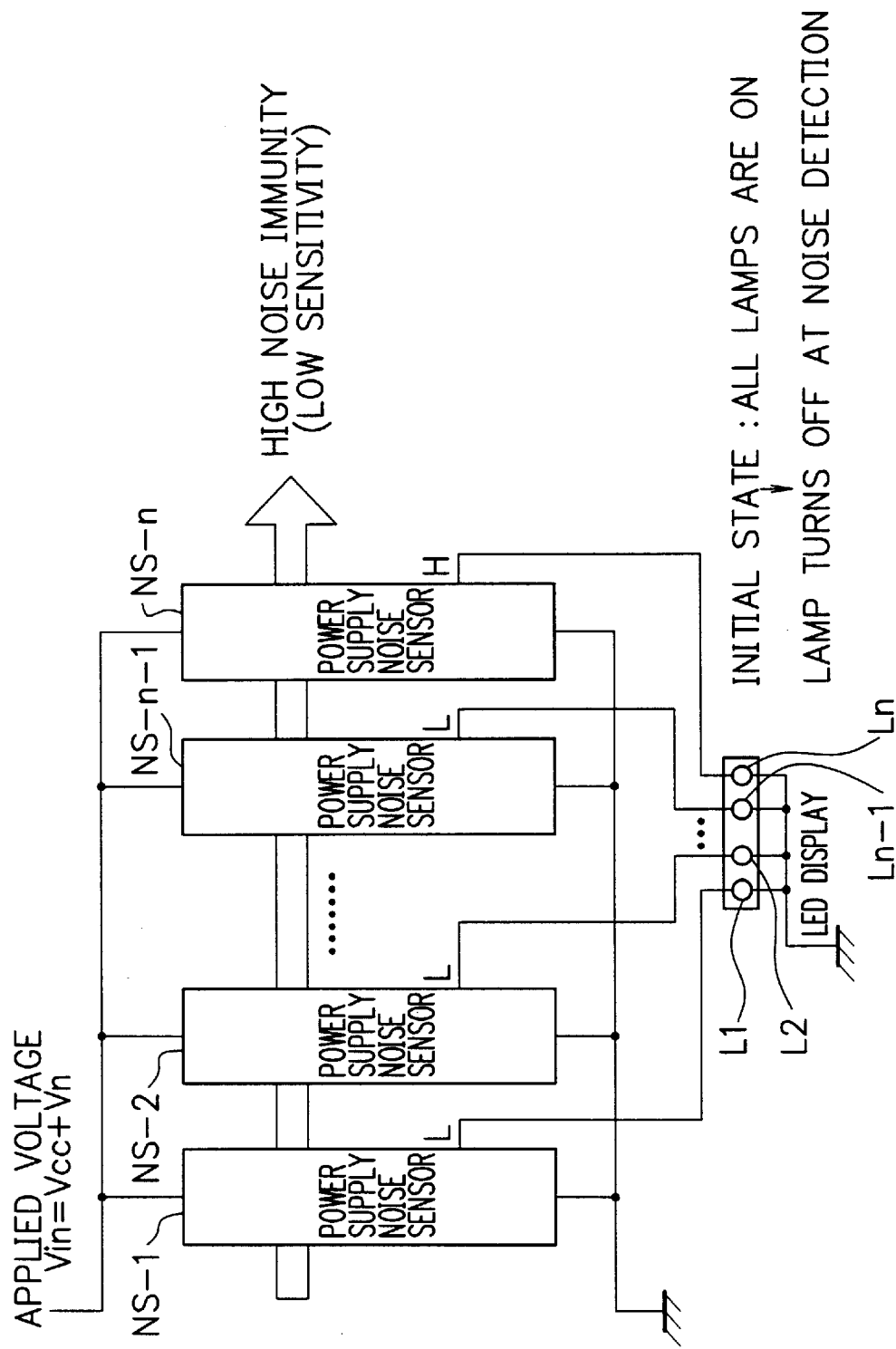

FIG. 6

| PARA-METERS | SENSOR CIRCUITS | R1 | 1KΩ |
| --- | --- | --- | --- |
| | | R2 | 22KΩ |
| | | R3 | 40KΩ |
| | | R4 | 1KΩ |
| | | R5 | 5KΩ |
| | | R6 | 5KΩ |
| | | C1 | 2200pF |
| | | Tc | 2.1μs |
| | NOISE | tw | 200ns |
| | | tr | 10ns |
| | | tf | 10ns |
| NOISE IMMUNITY NI+ | | | 1.8V |

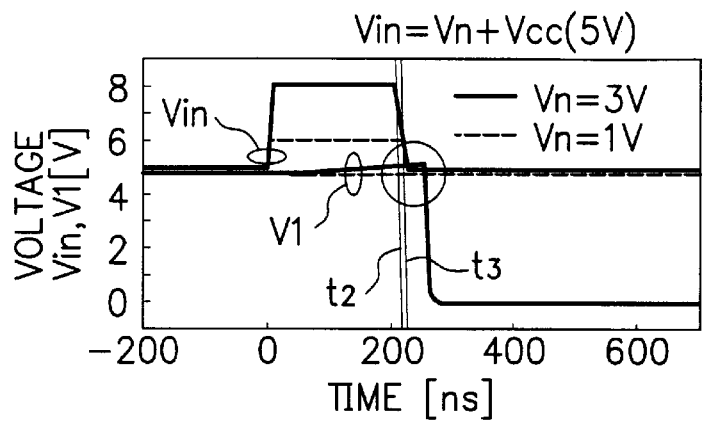
F I G. 7A
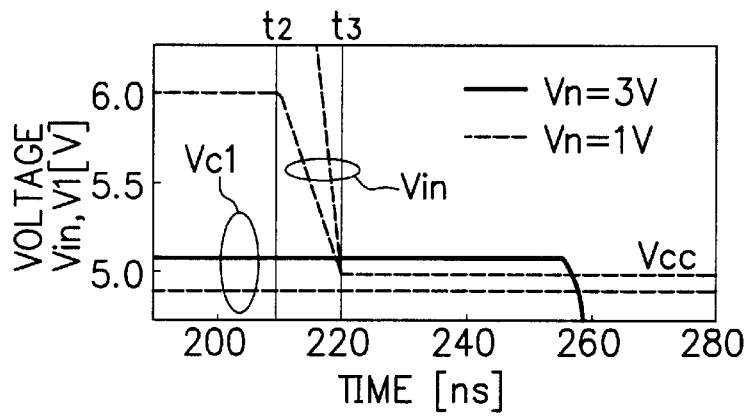
F I G. 7B
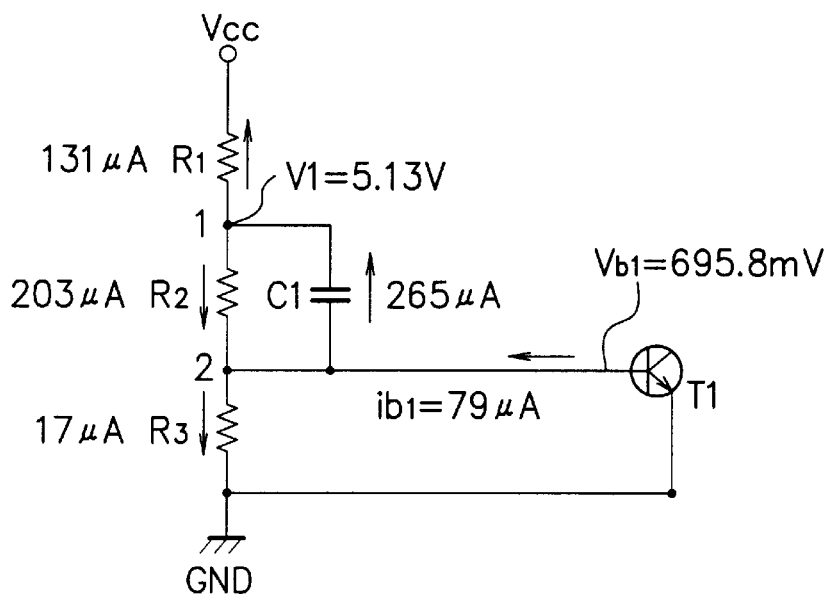
F I G. 8

POWER SUPPLY NOISE SENSOR

BACKGROUND OF THE INVENTION

The present invention relates to a power supply noise sensor for sensing impulse noise or glitch which causes, when applied to a power supply line of a digital system, an erroneous operation in the digital system.

DESCRIPTION OF THE PRIOR ART

Digital systems including digital circuits have been today put to use in various fields. It generally considered that a digital circuit is more resistive against noise than an analog circuit. However, when the noise exceeds a limit value of error acceptable (noise immunity) for the digital circuit, a fatal error possibly occurs to considerably damage the digital circuit in some cases. On the other hand, most erroneous operations of digital systems are caused by noise entering from a signal line and a power supply line. Reference is to be made to "Noise of Control Devices and Countermeasure against Noise" written in IEEJ Technical Report II, No. 123 published in 1979.

Particularly, when noise enters a digital circuit from a power supply side, it cannot be forecasted that an output is at a high (H) level or a low (L) level. This makes it more difficult to appropriately cope with the noise. To implement a system of fail safe type for failures in a digital circuit, a redundant system including a backup system is generally incorporated in the fail-safe system. However, the power supply noise similarly causes an erroneous operation also in the backup system, and hence the backup system does not satisfactorily function to implement a fail-safe system depending on cases.

According to a method to implement a fail-safe system against noise superimposed on the power supply system, when a power supply noise is detected, the digital system is controlled, according to the detected signal, to be set to a safe mode, namely, a state in which an erroneous operation does not take place. A device to detect the noise superimposed onto the power supply system is, for example, "a power supply monitor circuit" described in Japanese Patent Application Laid-Open No. HEI 9-054620 or "a power supply noise detector circuit" described in Japanese Patent No. 2953761. According to the Japanese Patent Application Laid-Open No. HEI 9-054620, a delay circuit and a through-rate detector circuit is combined with each other to prevent an erroneous operation of the power supply monitor circuit such that a reset signal is produced when power is lowered to a value equal to or less than a predetermined through rate or when a low-power state continues for a period of time equal to or more than a predetermined period of time. On the other hand, according to Japanese Patent No. 2953761, an asynchronous input sensitive to noise, namely, a clock input terminal of a flip—flip circuit is connected to a power supply such that the flip-flop circuit is inverted or activated by noise superimposed onto the power supply. Moreover, Japanese Patent No. 2703890 describes "a semiconductor integrated circuit" associated with improvement of a reset unit which implements a power-on operation when a power supply voltage is considerably lowered, for example, by an instantaneous interruption of power. This circuit also includes a power-on detector circuit which generates a one-shot pulse in response to power-on operation.

However, there remain problems that the "power supply monitor circuit" detects a variation in a power supply signal with a relatively low frequency, and on the other hand, the flip-flop circuit of the "power supply noise detector circuit" may conduct an erroneous operation when power supply noise is received. Additionally, the "semiconductor integrated circuit" operates in a state in which the output signal from the power supply is at a low level; however, any countermeasure is described against impulse noise in a positive direction. Moreover, either one of the above techniques to detect power supply noise is attended with a problem that the circuit configuration becomes complex. Impulse noise is in general in a damped oscillation when the noise reaches the LSI, and hence the noise varies in both directions, namely, in the negative and positive directions. Therefore, the technique to cope with the impulse noise in only one direction, namely, the negative or positive direction cannot be satisfactory in practical applications.

SUMMARY OF THE INVENTION

It is therefore an object of the present invention to provide a power supply noise sensor constructed in a simple configuration capable of sensing or detecting a variation in the power supply output signal with a high frequency in which impulse noise in the position direction and impulse noise in the negative direction superimposed onto a power supply system of the power supply noise sensor can be sensed with high reliability.

In accordance with the present invention, there is provided a power supply noise sensor, comprising a noise sensing section for sensing impulse noise applied to a power supply line; and an output holding section for holding a sense output from said noise sensing section, said noise sensing section including a time constant circuit for gradually varying a power supply voltage including impulse noise, wherein when a peak value of the impulse noise reduces after the peak value exceeds a predetermined value, a direction of a current flowing through said time constant circuit is inverted to hold a noise output from said output holding section also after the impulse noise disappears. Therefore, the impulse noise superimposed onto the power supply line can be appropriately sensed, and hence each circuit can be easily protected.

Moreover, in said power supply noise sensor, said noise sensing section comprises a first resistor, a second resistor, and a third resistor connected in series between a power supply terminal and ground; a capacitor forming said time constant circuit together with said first and second resistors, said capacitor being connected in parallel to said second resistor; and a first transistor including a base, a collector, and an emitter, the base being connected to a connecting point between said second and third resistors, the collector being connected via a fourth resistor to said power supply terminal, said emitter being connected to ground. In consequence, the noise sensor can be implemented in a simple circuit configuration.

Additionally, in said power supply noise sensor, said output holding section comprises a fifth resistor and a sixth resistor connected in series between ground and a connecting point between said fourth resistor and the collector of said first transistor; and a second transistor including a base, a collector, and an emitter, the base being connected to a connecting point between said fifth and sixth resistors, the collector being connected to a connecting point between said first and second resistors, said emitter being connected to ground. As a result, the noise sensing and holding operation can be achieved using a simple circuit configuration.

Furthermore, in said power supply noise sensor, a base current of said first transistor is larger after the sensing of the impulse noise than before the sensing thereof. Therefore, the noise can be sensed with higher reliability.

Moreover, said power supply noise sensor further comprises a reset circuit for turning said first transistor on at power on or after the sensing of the impulse noise, said reset circuit being a first switch circuit for lowing a base potential of said second transistor to a potential of ground. Consequently, after the detection of the noise, the state of the noise sensor can be restored to the noise sense ready state in any situation.

Additionally, said power supply noise sensor further comprises a reset circuit for turning said first transistor on at power on or after the sensing of the impulse noise, said reset circuit being a second switch circuit for connecting the collector of said second transistor to a power supply terminal. Therefore, the state of the noise sensor can be recovered after the noise detection to the noise sense ready state in any situation.

Further more, said power supply noise sensor further comprises a reset circuit for turning said first transistor on at power on or after the sensing of the impulse noise, said reset circuit being a third switch circuit for lowing a collector potential of said first transistor to a potential of ground. In consequence, after the noise is detected, the noise sensor can be restored to the noise sense ready state in any situation.

In accordance with the present invention, there is provided a power supply noise sensor, comprising a parallel connection including a plurality of sets each of which includes said noise sensing section and said output holding section, said sets each including said noise sensing section and said output holding section having mutually different time constants. In the configuration, there can be implemented a noise sensing operation with different sensitivity for impulse noise, that is, noise can be sensed according to different magnitude thereof.

BRIEF DESCRIPTION OF THE DRAWINGS

The objects and features of the present invention will become more apparent from the consideration of the following detailed description taken in conjunction with the accompanying drawings in which:

FIG. 5 is a schematic diagram showing a noise level sensor including a parallel connection of power supply noise sensors of the present invention;

FIG. 6 is a table for explaining circuit parameters of the power supply noise sensor shown in FIG. 1;

FIGS. 7A and 7B are graphs showing a transient response of an output from the power supply noise sensor in accordance with the present invention;

FIG. 8 is a schematic diagram for explaining a direction of a current flowing in the power supply noise sensor of FIG. 1 at a noise vanishing point of time t3.

DESCRIPTION OF THE EMBODIMENTS

Referring next to the accompanying drawings, description will be given of an embodiment in accordance with the present invention. As can be seen from FIG. 1, the power supply noise sensor includes a noise sensing section A to sense impulse noise applied to a power supply line of the sensor and an output holding section B to hold an output which is a signal sensed by the noise sensing section A. The section A has an aspect that its time constant circuit dominates a transient response of a base current of a transistor in association with a power supply noise. That is, the time constant circuit includes a resistor R1 as a first resistor disposed between a power supply terminal of a power supply voltage Vcc and a node N1 and a parallel circuit including a resistor R2 as a second resistor arranged between the node N1 and a node N2 and a capacitor C1. The power supply noise sensor includes a transistor T1 having a base, a collector, and an emitter. The node N2 of the time constant circuit is connected to the base of the transistor T1. The collector of the first transistor T1 is linked via a resistor R4 as a fourth resistor with a power supply terminal, and the base thereof is grounded. The node N2 is connected via a resistor R3 as a third resistor to ground.

In the output holding section B, a resistor R5 as a fifth resistor is connected in series to a resistor R6 as a sixth resistor. The resistor R5 includes an input port coupled with a node N3 which is a connecting point between the resistor R4 and the collector of the transistor 1, and the resistor R6 includes a port connected to ground. The power supply noise sensor includes a transistor T2 as a second transistor including a base, a collector, and an emitter. The base of the transistor T2 is connected to a node N4 as a connecting point between the resistors 5 and 6. The collector of the transistor T2 is linked with the node N1 and the emitter thereof is coupled with ground. The power supply noise sensor also includes reset switches S1 and S2. The switch S1 is disposed between the base of the transistor T2 and ground, and the switch S2 is disposed between the collector of the transistor T2 and a power supply terminal.

Figure 2:
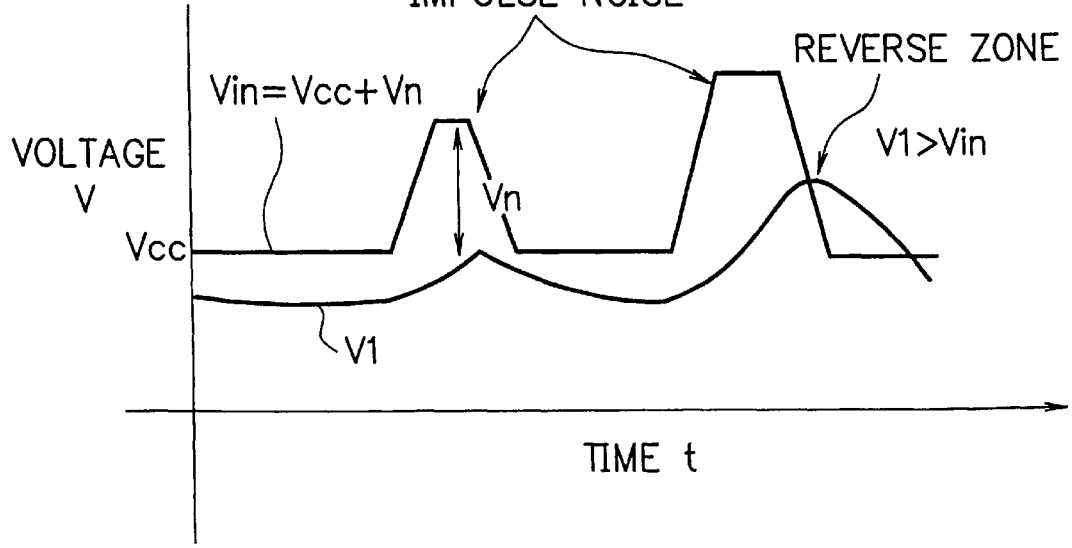
FIG. 2 is a signal timing chart showing signals of respective sections of a noise sensing section of FIG. 1.

Next, operation of the power supply noise sensor will be described. The sensor operates according to an operation principle having an aspect to gradually vary potential V1 of the node 1, as shown in FIG. 2, with respect to a change in the power supply voltage caused by impulse noise to be sensed. In a power supply voltage Vin generated by superimposing a noise voltage Vn onto the power supply voltage Vcc, when a peak value of the changing noise voltage Vn exceeds a predetermined value, i.e., a setting value, V1>Vin takes place when the noise voltage Vn decreases. This reverses or inverts a direction of a current passing through the resistor R1 and the base current of the first transistor T1 changes its direction to a negative or reverse direction. Therefore, the state of the transistor T1 changes from an on state to an off state. As a result, a reverse output V2 from the first transistor T1 is transferred to the output holding section B, and the state of the second transistor T2 changes from an off state to an on state. This varies an output Vout from a high (H) level to a low (L) level, and hence the sensor output is kept holding also after the noise disappears.

Figure 3:
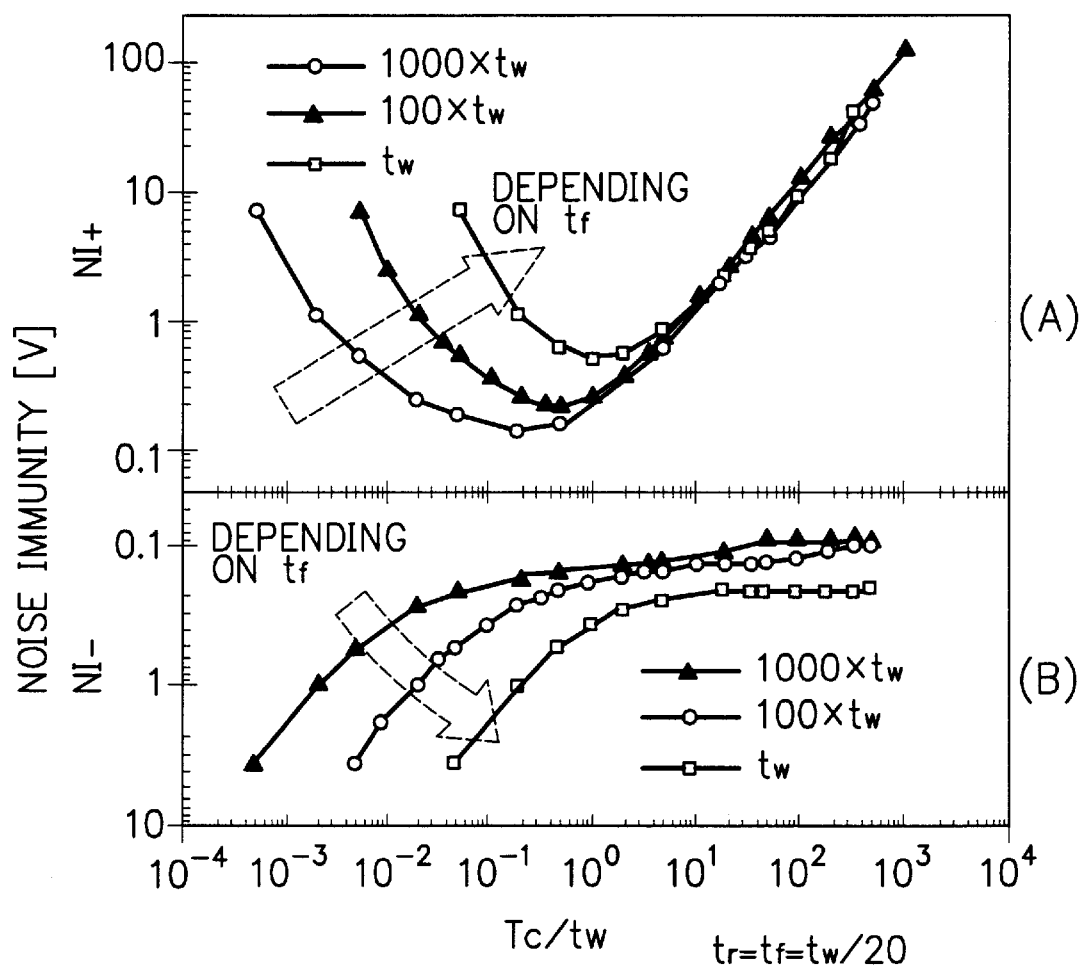
FIGS. 3A and 3B are graphs showing relationships between a time constant and sensitivity of the noise sensing section as shown in FIGS. 4A and 4B, respectively.
Figure 4A:
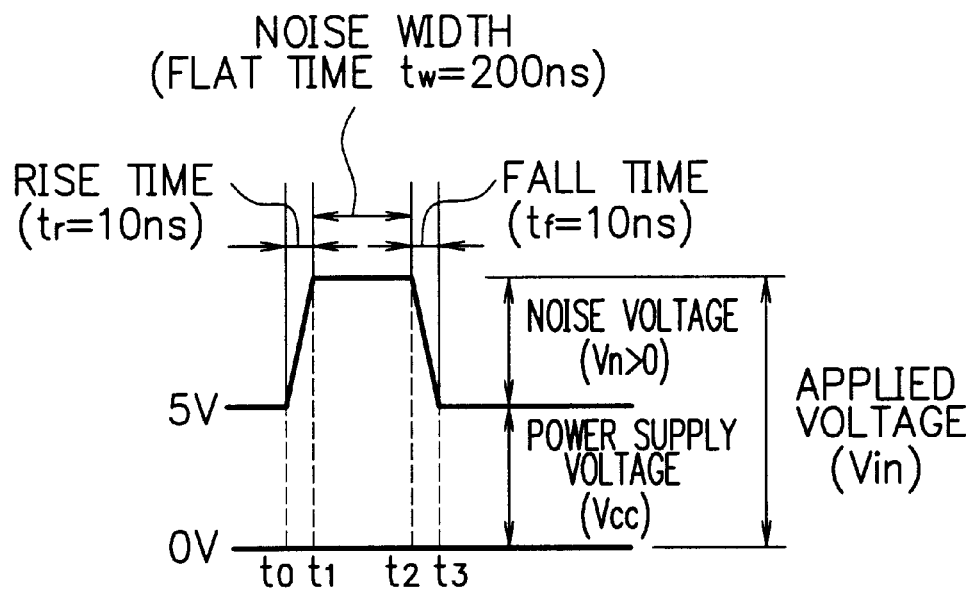
FIGS. 4A and 4B are graphs showing impulse noise superimposed onto a power supply voltage.
Figure 4B:
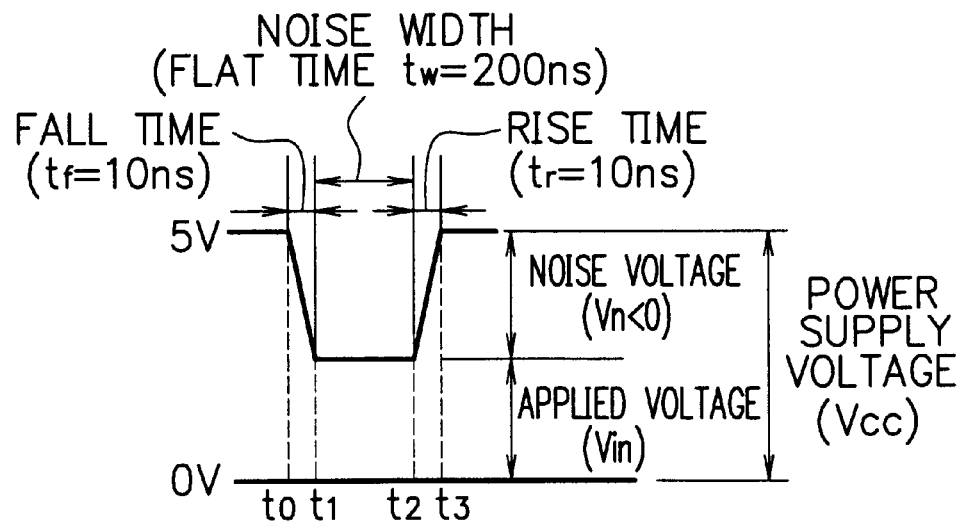

FIG. 3 shows a relationship between a time constant Tc and sensitivity of the noise sensing section in a graph. In this case, impulse noise applied to the power supply system has a shape of a trapezoid as shown in FIGS. 4A and 4B and a rise time $t_r$ and a fall time $t_f$ are $\frac{1}{20}$ of flat time $t_w$. The sensitivity is indicated by a peak value Vn of the trapezoid when the inversion takes place. In the graph of FIG. 3, an abscissa represents a value obtained by normalizing for generalization the time constant tc according to width of the noise $t_w$ used for the measurement. As a result, the power supply noise sensor in accordance with the present invention has an advantageous aspect that the sensor detects impulse noise with highest sensitivity when the time constant tc is in a range from about the width of noise $t_w$ to be sensed to about one tenth of $t_w$.

On the other hand, to fix the output Vout to a low (L) level in the output holding section B, the low-level output is fed back to the gate of the transistor T1. However, when the low-level output is directly coupled with the gate of the transistor T1, an output before detection becomes a low level substantially equal to the base voltage (about 0.4 V to about 0.7 V depending on a characteristic of the transistor). To overcome this difficulty, the low-level output is connected to the node N1 of the time constant circuit in the power supply noise sensor of the present invention. Resultantly, it is possible to obtain a desired time constant, and an appropriate potential difference appears between the output voltage Vout and the base voltage of the first transistor.

Therefore, after the impulse noise is first sensed, the voltage V1 of the node N1 takes a sufficiently low value. However, when similar impulse noise is next applied to the power supply system, the potential V1 of the node N1 increases. When the potential V1 becomes a value ranging from about 0.4 V to about 0.7 V at which the base potential of first transistor T1 can turn the transistor T1 on, there possibly occurs a situation in which the first transistor T1 turns on again and re-inversion occurs to change the output Vout from a low (L) level to a high (H) level. To prevent the re-inversion of the output Vout to continuously keep the output Vout at a stable low level, the power supply noise sensor of the present invention has two remarkable aspects. First, intentionally, a speedup capacitor is not disposed for the base of the second transistor T2. This results in an advantage that the time constant takes a value of "0" for the noise on the power supply system of the second transistor T2. Therefore, V1 continuously follows the variation in the power supply voltage Vin for resultantly prevent the inversion of the potential. Consequently, the output Vout cannot be reversed.

Figure 1:
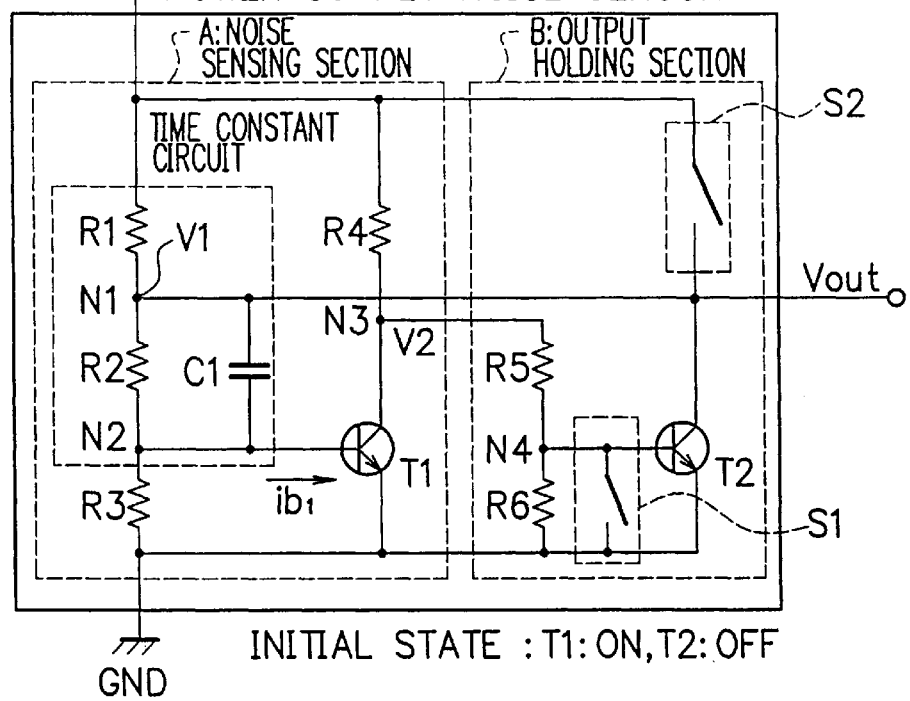
FIG. 1 is a diagram showing an embodiment of a power supply noise sensor in accordance with the present invention.

Second, even if the speedup capacitor is disposed, the re-inversion can be prevented by setting, after the second transistor T2 is turned on, the base current of the second transistor T2 to a fully high value. Therefore, the base of the second transistor T2 is directly connected to the node N3, not shown, or is connected to a node 4 as shown in FIG. 1. The node 4 between the resistors 5 and 6 connected in series between the node N3 and ground divide the voltage so that the base current is sufficient to turn the second transistor T2 on.

In an actual operation, the power supply noise sensor must be initialized such that the first transistor T1 is on in the initial state. Particularly, to prevent the re-inversion described above, circuit constants are beforehand selected to turn the second transistor T2 on immediately after the system is first powered. In this regard, a reset circuit is arranged as a peripheral circuit of the power supply noise sensor to reset the power supply noise sensor after the sensor is powered and after detection of impulse noise so that the power supply noise sensor is set to a noise waiting state. As the reset circuit, it is desirable to dispose a first switch circuit S1 to lower the base potential of the second transistor T2 to the potential of ground, a second switch circuit S2 to form a short circuit between the output Vout to the power supply voltage Vcc, or a third switch circuit S3, not shown, to lower the node 3 the ground potential FIG. 5 shows an example of application in which the power supply noise sensor in accordance with the present invention is employed as a basic circuit. The configuration of FIG. 5 includes a plurality of basic circuits NS-1 to NS-n connected in parallel to each other. The noise detecting sections A of the respective basic circuits NS-1 to NS-n are different from each other and hence the sensitivity to the power supply noise varies between the basic circuits having respective output terminals. When the output terminals are respectively connected to display devices such as light emitting diodes L1 to Ln arranged in an ascending order of sensitivity of the sensors, the noise can be sensed to be displayed according to levels of magnitude thereof.

FIG. 6 shows circuit constants of the circuit of FIG. 1, parameters of an impulse nose waveform (trapezoidal waveform) applied to a power supply system for evaluation, and sensitivity in the evaluation. FIGS. 7A and 7B show results of simulation conducted using an analog electronic circuit simulation program called SPICE. FIG. 7B shows a magnified view of a section in a circle shown in FIG. 7A. FIG. 8 shows currents obtained by the simulation at noise disappearing point of time t3.

Figure 9:
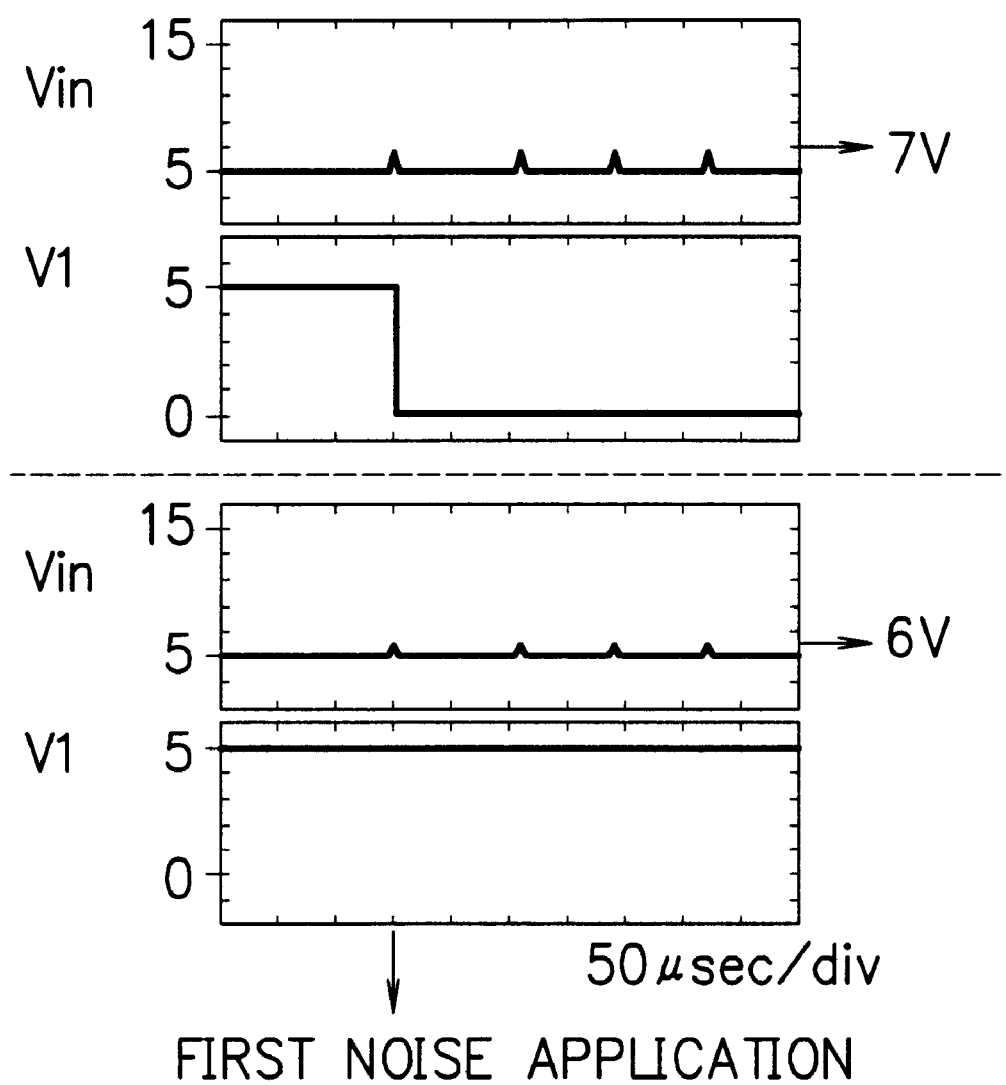
FIG. 9 is a graph showing noise applied to a power supply line and detected by the power supply noise sensor of FIG. 1.

FIG. 9 shows an example of power supply noise sensed in an actual circuit of the power supply noise sensor in accordance with the present invention. Since the sense voltage is 6.8 V (Vn=4 and sensitivity=1.8V) according to FIG. 6, noise is not detected for Vn=1 V. However, for noise at Vn=2V, the output is changed from a high (H) level to a low (L) level when the first noise is applied, but no reaction is detected for subsequent noise. This means that the first noise is detected in a stable state.

In accordance with the present invention, since a transistor "2SC3732" is used for each of the first and second transistors T1 and T2 having a high transient frequency ft, i.e., 750 megaherz (MHz), it is possible to sense noise with a noise width $t_w$ of 200 nanoseconds (ns) as shown in the drawings. However, when a low-speed transistor having a lower transient frequency ft as "2SC3732", there appears a tendency of the lowering of sensitivity. It is therefore required to appropriately select the transistors T1 and T2.

In accordance with the present invention described above, the noise sensing section includes a time constant circuit to gradually vary the power supply voltage containing impulse noise such that when the peak value of the impulse noise reduces after the peak value exceeds a predetermined value, the direction of the current passing through the time constant circuit is inverted to keep the noise output from the output holding section after the impulse noise disappears. In this configuration, it is guaranteed to sense impulse noise in a forward direction and impulse noise in a reverse direction applied to the power supply. The circuit system can be implemented in a simple configuration at low cost. Therefore, the power supply noise sensor can be easily incorporated in an apparatus without requiring another power supply. By employing the output from the power supply noise sensor to implement fail-safe control or to reset a system, there can be obtained an advantage to remarkably improve the reliability with respect to impulse noise of the power supply of the system.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A power supply noise sensor, comprising:
 a noise sensing section for sensing impulse noise applied to a power supply line; and
 an output holding section for holding a sense output from said noise sensing section,
 said noise sensing section including a time constant circuit for gradually varying an inner voltage associated with a power supply voltage including impulse noise, wherein
  when a peak value of the impulse noise reduces after the peak value exceeds a predetermined value, a direction of a current flowing through said time constant circuit is inverted to hold a noise output from said output holding section also after the impulse noise disappears.

2. A power supply noise sensor in accordance with claim 1, wherein said noise sensing section comprises:
 a first resistor, a second resistor, and a third resistor connected in series between a power supply terminal and a bias terminal;
 a capacitor forming said time constant circuit together with said first and second resistors, said capacitor being connected in parallel to said second resistor; and
 a first transistor including a base, a collector, and an emitter,
 the base being connected to a connecting point between said second and third resistors,
 the collector being connected via a load to said power supply terminal.

3. A power supply noise sensor in accordance with claim 2, wherein said output holding section comprises:
 a fourth resistor connected between the bias terminal and a connecting point between the load and the collector of said first transistor; and
 a second transistor including a collector and an emitter,
 the collector being connected to a connecting point between said first and second resistors,
 said emitter being connected to the bias terminal.

4. A power supply noise sensor in accordance with claim 3, wherein a base current of said first transistor is larger after the sensing of the impulse noise than before the sensing thereof.

5. A power supply noise sensor in accordance with claim 3 or 4, further comprising a reset circuit for turning said first transistor on at power on or after the sensing of the impulse noise,
 said reset circuit being a first switch circuit for lowing a base potential of said second transistor to a potential of ground.

6. A power supply noise sensor in accordance with claim 3 or 4, further comprising a reset circuit for turning said first transistor on at power on or after the sensing of the impulse noise,
 said reset circuit being a second switch circuit for connecting the collector of said second transistor to a power supply terminal.

7. A power supply noise sensor in accordance with claim 3 or 4, further comprising a reset circuit for turning said first transistor on at power on or after the sensing of the impulse noise,
 said reset circuit being a third switch circuit for lowing a collector potential of said first transistor to a potential of ground.

8. A power supply noise sensor in accordance with one of claims 1 to 3, comprising a parallel connection including a plurality of sets each of which includes said noise sensing section and said output holding section,
 said sets each including said noise sensing section and said output holding section having mutually different time constants.

9. A power supply noise sensor in accordance with claim 4, comprising a parallel connection including a plurality of sets each of which includes said noise sensing section and said output holding section,
 said sets each including said noise sensing section and said output holding section having mutually different time constants.

10. A power supply noise sensor in accordance with claim 5, comprising a parallel connection including a plurality of sets each of which includes said noise sensing section and said output holding section,
 said sets each including said noise sensing section and said output holding section having mutually different time constants.

11. A power supply noise sensor in accordance with claim 6, comprising a parallel connection including a plurality of sets each of which includes said noise sensing section and said output holding section,
 said sets each including said noise sensing section and said output holding section having mutually different time constants.

12. A power supply noise sensor in accordance with claim 7, comprising a parallel connection including a plurality of sets each of which includes said noise sensing section and said output holding section,
 said sets each including said noise sensing section and said output holding section having mutually different time constants.

* * * * *